(12) United States Patent
Branch-Sullivan et al.

(10) Patent No.: US 6,815,687 B1
(45) Date of Patent: Nov. 9, 2004

(54) METHOD AND SYSTEM FOR HIGH-SPEED, 3D IMAGING OF OPTICALLY-INVISIBLE RADIATION

(75) Inventors: Clair J. Branch-Sullivan, Ypsilanti, MI (US); Kimberlee J. Kearfott, Ann Arbor, MI (US); Bozidar Stojadinovic, Albany, CA (US); Douglas S. McGregor, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 09/549,464

(22) Filed: Apr. 14, 2000

Related U.S. Application Data
(60) Provisional application No. 60/129,837, filed on Apr. 16, 1999.

(51) Int. Cl.[7] .................. H01L 31/00; G01T 1/185; H01J 47/00; G02B 27/12
(52) U.S. Cl. .................. 250/389; 250/330; 359/630
(58) Field of Search .................. 250/330, 332, 250/334, 392, 394, 389; 345/8; 353/28; 359/630; 348/115

(56) References Cited

U.S. PATENT DOCUMENTS 3,932,861 A   1/1976   Bull (List continued on next page.)

FOREIGN PATENT DOCUMENTS

| GB | WO 98/31150 | * | 7/1998 | ............ H04N/7/18 |
| JP | 408094438 A | * | 11/1994 | ............ G01J/1/02 |
| JP | 408243105 A | * | 11/1996 | ............ A61B/10/00 |

OTHER PUBLICATIONS

Russ, J.C.: The Image Processing Handbook, Second Edition; 1995; CRC Press Inc; pp. 57–70.*

(List continued on next page.)

Primary Examiner—Georgia Epps
Assistant Examiner—Alicia M. Harrington
(74) Attorney, Agent, or Firm—Brooks Kushman, P.C.

(57) ABSTRACT

A high-speed, three-dimensional, gamma-ray imaging method and system as well as a detector and array of such detectors for use therein are provided which characterize radioactivity distributions in nuclear and radioactive waste and materials facilities by superimposing radiation images on a view of the environment using see-through display screens or shields to provide a stereoscopic view of the radiation. The method and system provide real-time visual feedback about the locations and relative strengths of radioactive sources. The method and system dynamically provide continuous updates to the displayed image illustrating changes, such as source movement. A pair of spaced gamma-ray cameras of a detector subsystem function like "gamma eyes". A pair of CCD cameras may be coupled to the detector subsystem to obtain information about the physical architecture of the environment. A motion tracking subsystem is used to generate information on the user's position and head orientation to determine what a user "sees". The invention exploits the human brain's ability to naturally reconstruct a 3D, stereoscopic image from 2D images generated by two "imagers" separated by a known angle(s) without the need for 3D mathematical image reconstruction. The method and system are not only tools for minimizing human exposure to radiation thus assisting in ALARA (As Low As Reasonably Achievable) planning, but also are helpful for identifying contamination in, for example, laboratory or industrial settings. Other optically-invisible radiation such as infrared radiation caused by smoldering fires may also be imaged. Detectors are manufactured or configured in curvilinear geometries (such as hemispheres, spheres, circles, arcs, or other arrangements) to enable sampling of the ionizing radiation field for determination of positional activity (absolute or relative amounts of ionizing radiation) or spectroscopy (energy distributions of photons). More than one detector system may be used to obtain three-dimensional information. The detector systems are specifically suitable for direct visualization of radiation fields.

26 Claims, 2 Drawing Sheets

U.S. PATENT DOCUMENTS

| | | | |
|---|---|---|---|
| 4,118,733 A | | 10/1978 | Sarson et al. |
| 4,574,197 A | * | 3/1986 | Kliever .................. 250/334 |
| 4,682,029 A | * | 7/1987 | Diepeveen et al. ......... 250/330 |
| 4,737,972 A | * | 4/1988 | Schoolman .................. 345/8 |
| 4,868,652 A | | 9/1989 | Nutton |
| 4,931,653 A | | 6/1990 | Hamm et al. |
| 4,957,369 A | | 9/1990 | Antonsson |
| 5,418,364 A | | 5/1995 | Hale et al. |
| 5,448,073 A | * | 9/1995 | Jeanguillaume ........ 250/363.02 |
| 5,493,595 A | * | 2/1996 | Schoolman ............... 378/41 |
| 5,534,694 A | * | 7/1996 | Ball et al. .................. 250/330 |
| 5,557,108 A | * | 9/1996 | Tumer .................. 250/392 |
| 5,751,576 A | * | 5/1998 | Monson .................. 364/188 |
| 5,815,411 A | * | 9/1998 | Ellenby et al. ............ 345/9 |
| 6,232,602 B1 | * | 5/2001 | Kerr .................. 250/330 |
| 6,283,598 B1 | * | 9/2001 | Inami et al. ............ 359/451 |
| 6,379,009 B1 | * | 4/2002 | Fergason .................. 353/28 |
| 6,476,391 B1 | * | 11/2002 | Zhang .................. 250/330 |
| 6,535,182 B2 | * | 3/2003 | Stanton .................. 359/630 |

OTHER PUBLICATIONS

Shockley, W., Currents to Conductors Induced by a Moving Point Charge, vol. 9, Oct. 1938.

Ramo, Simon, Currents Induced by Electron Motion, Proceedings of the I.R.E., Sep. 1939.

Day, R. B., et al., Noise, Trapping and Energy Resolution in Semiconductor Gamma–Ray Spectrometers, Hench and Coche: Noble Gas Scintillators, Los Alamos Scientific Laboratory, University of California, Feb. 1967.

Knoll, G.F., et al., Fundamentals of Semiconductor Detectors For Ionizing Radiation, Mat. Res.Soc. Symp. Proc., vol. 302, 1993.

McGregor, D.S., et al., Performance of CdZnTe Geometrically Weighted Semiconductor Frisch Grid Radiation Detectors, IEEE Transactions on Nuclear Science, vol. 46, No. 3, Jun. 3, 1999.

Barrett, H.H., et al., Charge Transport in Arrays of Semiconductor Gamma–Ray Detectors, The American Physical Society, Jul. 3, 1995.

McGregor, D.S., et al., CdZnTe Semiconductor Parallel Strip Frisch Grid Radiation Detectors, IEEE Transactions on Nuclear Science, vol. 45, No. 3, Jun. 1998.

Viala, M, et al., A Camera Based Augmented–Reality System For Teleoperation In Nuclear Environments, Proceedings of ICON 5: $5^{TH}$ International Conference on Nuclear Engineering, Nice, France, May 26–30, 1997.

Rocheleau, David N., et al., Development of a Graphical Interface For Robotic Operation In A Hazardous Environment IEEE, 1991, pp. 1077–1081.

Knight, Travis W., et al., Virtual Radiation Fields–A Virtual Environment Tool For Radiological Analysis and Simulation, Nuclear Technology, vol. 117, pp. 255–266, Feb. 1997.

Bullitt, E., et al., Three–Dimensional Reconstuction of Curves From Pairs of Projection Views in the Presence of Error. I. Algorithms, Am. Assoc. Phys. Med. vol. 24 (11), pp. 1671–1678, nov. 1997.

Bullitt, E., et al., Three–Dimensional Reconstruction of Curves From Pairs of Projection Views in the Presence of Error. II. Analysis of Error, Am. Assoc. Phys. Med., vol. 24 (11), pp. 1679–1687, Nov. 1997.

Chen, Shiuh–Yung James, et al., Improved Determination of Biplane Imaging Geometry From Two Projection Images and its Application to Three–Dimensional Reconstruction of Coronary Arterial Trees, Am. Assoc. Phys. Med., vol. 24 (5), pp. 633–654, May 1997.

Azuma, Ronal T., A Survey of Augmented Reality, Teleoperators and Virtual Environments 6, 4 (Aug. 1997), 355–385.

* cited by examiner

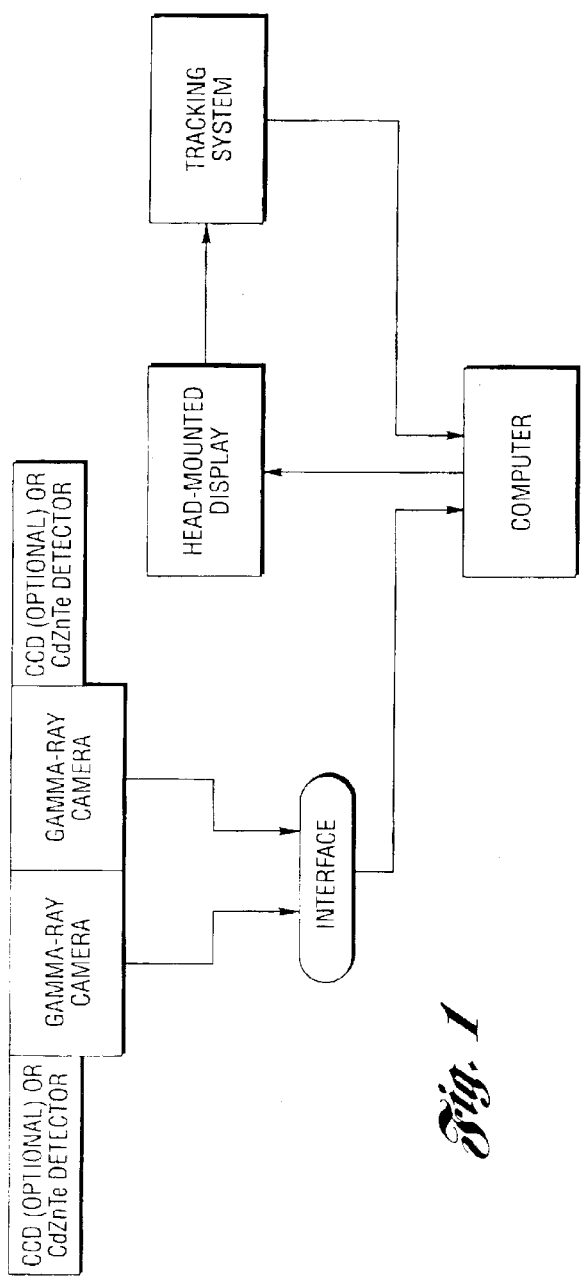
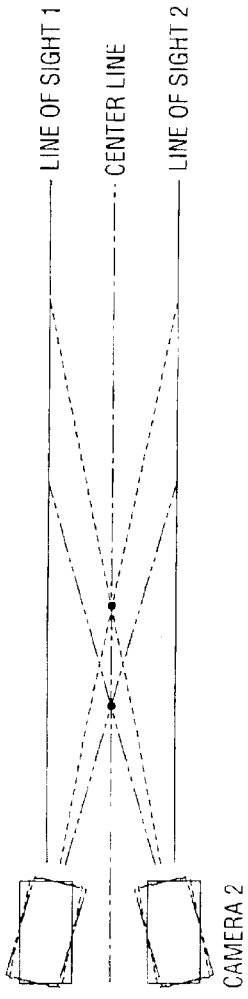

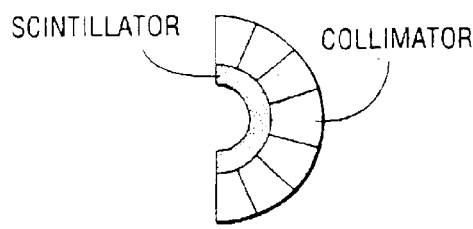
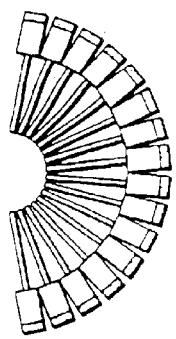
Fig. 4b
Fig. 3
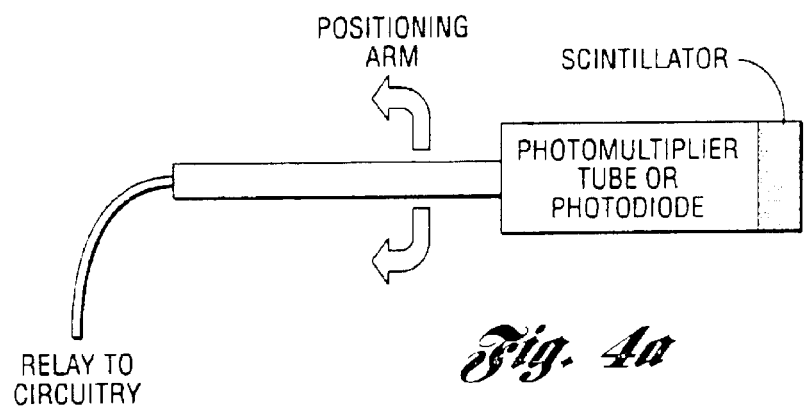
Fig. 4a
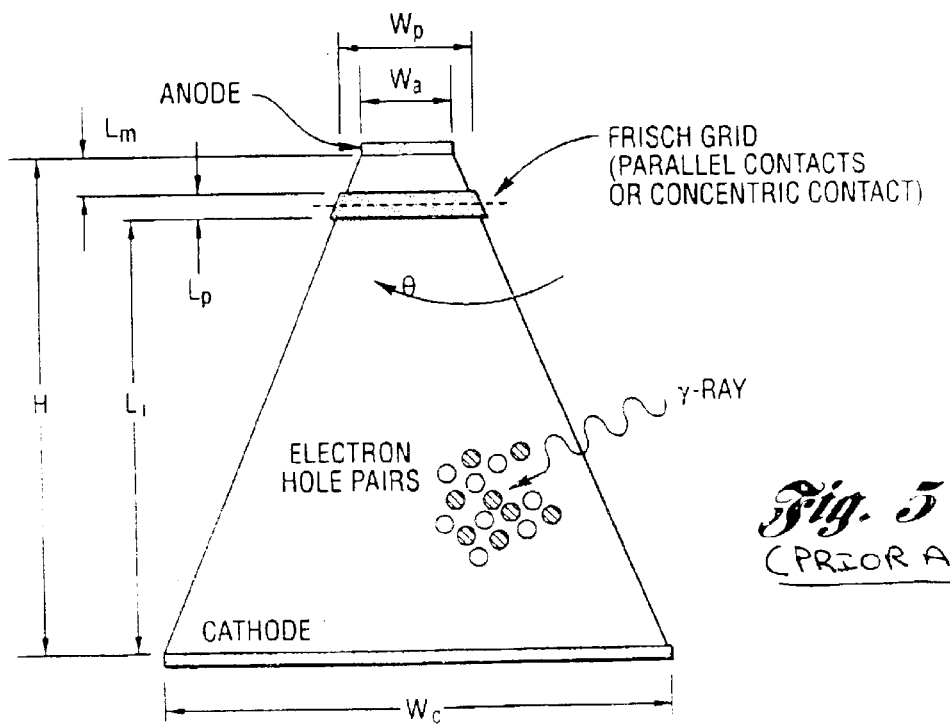
Fig. 5
(PRIOR ART)

METHOD AND SYSTEM FOR HIGH-SPEED, 3D IMAGING OF OPTICALLY-INVISIBLE RADIATION

CROSS-REFERENCE TO RELATED APPLICATION

This application claims the benefit of U.S. provisional patent application Ser. No. 60/129,837, filed on Apr. 16, 1999, entitled "Augmented Reality Radiation Display System and In Situ Spectrometry Method For Determining the Depth Distribution of Radionuclides". This application is related to co-pending U.S. patent application entitled "High-Resolution Ionization Detector and Array of Such Detectors" filed May 8, 1998 and having U.S. Ser. No. 09/075,351.

TECHNICAL FIELD

This invention relates to methods and systems for high-speed, 3D imaging of optically-invisible radiation and detectors and arrays of such detectors for use therein.

BACKGROUND ART

One of the fundamental problems involving work with radioactive materials is that radiation is invisible to the human eye and thus poses an invisible hazard. The hazard is compounded when one considers that these materials can be present in an environment when not expected such as with radioactive contamination or leaking radioactive waste storage tanks. To make the concern even more valid, these sources of radiation can be moving, as can be the case with airborne contamination. Thus, it is clear that there is a need for a way to localize radioactive sources, preferably in real-time.

Much work has been done on ways to image various forms of radiation to provide the user with a "picture" of the radiation present in an environment. Currently available gamma-ray cameras are capable of providing two-dimensional information about the location and spectroscopy of a radioactive source similar to taking a snapshot with a standard camera. However, these cameras are not independently capable of providing information to locate the source in three dimensions. There have been cameras built that are capable of obtaining real-time information, which is useful for viewing changing sources. However, based on current designs, the performance of some tasks in radiation environments precludes simultaneous monitoring of the radiation field by the individual worker, possibly resulting in increased radiation exposures. 3D detection systems are available for medical and other environments, but these involve different geometries and source distributions than those considered here. Also, these methods rely on complex mathematical reconstruction making them cumbersome and time-consuming.

A new problem arises if one considers the complex environments that these sources can exist in since even when radiation images are blended with light images three-dimensionality is lost, real-time manipulation of the images becomes complex, and difficulties arise with time-varying source distributions. Only three-dimensional source location truly allows for accurate position determinations of radioactive materials. Furthermore, real-time simultaneous display of the physical and radiation environments is essential for observing moving or redistributing radiation sources.

Augmented Reality

Both virtual reality (VR) and augmented reality (AR) provide real-time interactivity which requires 3D registration. VR and AR require a motion tracker to determine the user's position in the virtual environment (VE), a computer to coordinate the user's relative location, and a display. VR and AR are currently being used in various fields including research and development, design and testing, navigation and targeting, training, and visualization (Azuma, 1997). There exists a wide variety of hardware and software capable of displaying VEs. Virtual Reality Modeling Language (VRML) 2.0 is the current industry standard for programming with many large software packages, such as AutoCAD and 3D Studio Max (Autodesk, Inc.), exporting to this file format. The display of VR is achieved by a head-mounted device (HMD), head-coupled display (HCD), or a Cave Automatic Virtual Environment (CAVE). AR display is limited to HMDs with modifications that allow the user to see the real world through the display.

With an VE application, there are always certain limitations that current researchers are trying to overcome. Those who program for VR or AR applications must achieve a high level of realism while not slowing down the computer system to intolerable speeds. Designers of VR and AR hardware must always consider problems arising from concerns of simplicity, spatial resolution, and safety. For AR, one must also be concerned with using reasonable separation for data collection and display so as to simulate the user's interpupillary distance. Focus also presents a current field of AR research since the human eye, when observing real objects, must match virtual object focus at the same distance as the physical objects. Finally, current research is being conducted into how to increase the field of view of HMDs and HCDs to most accurately match that of the user (Azuma, 1997).

Semiconductor Technology

Semiconductor devices typically operated by measuring the number of electrons and holes excited by ionizing radiation (gamma rays or charged particles) within the detector. The number of excited charge carriers is remarkably linear with respect to the absorbed energy from an ionizing event. The excited charge carriers are drifted across the semiconductor detector by an externally applied electric field, which, in turn, produces an image charge or induced charge on the output circuit. Electrons are drifted toward the device anode and holes are drifted toward the device cathode. For a planar detector, the Shockley-Ramo (Shockley, 1938; Ramo, 1939) theorem describes the relationship between the induced charge ($Q^*$) and the displacement distance of the free electrons and holes:

$$Q^* = Q_0 \frac{|\Delta x_e| + |\Delta x_h|}{W_D} \tag{1}$$

where $Q_0$ is the initial magnitude of free charge liberated, $\Delta x$ refers to the distance traveled by the electrons or holes from their point of origin toward their respective electrode, $W_D$ is the width of the planar detector, and e and h subscripts refer to electrons and holes, respectively. If the charge carriers are removed completely from the device, in which case they reach their respective electrodes, then the solution to Equation (1) is simply $Q^*=Q_0$. The importance of this result is that gamma-ray spectroscopy can be performed by simply measuring the total induced charge measured from electrons and holes drifted to the detector electrodes. In the presence of charge carrier trapping (caused by imperfections in the semiconductor), charge carriers often do not reach their respective electrodes, and the induced charge observed becomes very dependent on the location of the gamma-ray interaction (Day, Dearnaley and Palms, 1967; Knoll and McGregor, 1993). The Hecht relationship (Hecht, 1932) describes the expected induced charge for a planar detector with charge trapping:

$$Q^* = Q_0\left\{\rho_e\left(1 - \exp\left[\frac{x_i - W_D}{\rho_e W_D}\right]\right) + \rho_h\left(1 - \exp\left[\frac{-x_i}{\rho_h W_D}\right]\right)\right\} \quad (2)$$

where $x_i$ represents the interaction location in the detector as measured from the cathode. The electron or hole carrier extraction factor (Knoll and McGregor, 1993) is described by:

$$\rho_{e,h} = \frac{v_{e,h}\tau^*_{e,h}}{W_D} \quad (3)$$

where $v$ is the charge carrier mobility and $\tau^*$ is the carrier mean free drift time before a trapping event occurs. As can be observed from Equations (2) and (3) the induced charge becomes a function of the interaction location within the detector. High $\rho$ values (above 50) for both electrons and holes are desirable for high resolution gamma-ray spectroscopy. Unfortunately, the value of $\rho_h$ for most compound semiconductors is generally much lower than the value of $\rho_e$. Largely differing values of $\rho$ for electrons and holes are not conducive to high resolution gamma-ray energy spectroscopy when using simple planar semiconductor detector designs (Day, Dearnaley and Palms, 1967; Knoll and McGregor, 1993).

Recent results with novel geometrically weighted Frisch grid CdZnTe detectors demonstrate dramatic improvements in gamma-ray resolution. The devices no longer require signals from hole transport, hence the higher carrier extraction factor values of the electrons can be manipulated while ignoring the difficulties imposed by hole trapping. The device uses the geometric weighting effect, the small pixel effect and the Frisch grid effect to produce high gamma-ray energy resolution. The design is simple and easy to construct. The device performs as a gamma-ray spectrometer without the need for pulse shape rejection or correction, and it requires only one signal output to any commercially available charge sensitive preamplifier. The device operates very well with conventional NIM electronic systems. Presently, room temperature (23° C.) energy resolutions of 2.68% FWHM at 662 keV and 2.45% FWHM at 1.332 MeV have been measured with 1 cubic cm CdZnTe devices.

FIG. 5 shows the basic features of a geometrically weighted semiconductor Frisch grid radiation detector. The device dimensions are designated as follows: cathode width=$W_c$, anode width=$W_a$, width at the pervious region center=$W_p$, interaction region height=$L_i$, pervious region height=$L_p$, measurement region height=$L_m$, overall detector height=H and the detector length=D. The major physical effects for the device are briefly discussed in the following sections.

For simplicity, one assumes that gamma-ray interactions occur uniformly throughout the detector volume. For a trapezoidal prism, the fraction of gamma-ray interactions occurring in the interaction region is approximated by:

$$F_i \approx \frac{(W_c + W_p)(2L_i + L_p)}{2(W_a + W_c)(L_i + L_p + L_m)}, \quad (4)$$

For the following examples, a restraint of $W_a$=2 mm is imposed in all cases. With $W_c$=10 mm, D=10 mm, H=10 mm, θ=43.5° and with the Frisch grid=1 mm wide centered 2.0 mm back from the anode, the fraction of events occurring in the interaction region can be shown to be 85.3%. The overall result is high gamma-ray sensitivity in the interaction region and high rejection for gamma-ray interactions occurring in the measurement region while retaining good screening with the Frisch grid.

The gamma-ray interaction probability distribution function is highest near the cathode and lowest near the anode for a trapezoidal prism semiconductor Frisch grid detector. For uniform irradiation, the normalized total gamma-ray probability distribution function for a trapezoidal device is:

$$P_N(x)dx = \frac{2x\tan\left(\frac{\theta}{2}\right) + W_a}{H^2\tan\left(\frac{\theta}{2}\right) + HW_a}dx, \; 0 \leq x \leq H, \quad (5)$$

where x refers to the distance from the anode toward the cathode and θ refers to the acute angle at the anode (see FIG. 5). Returning to the previous example, consider the number of gamma-ray interactions that occur within 1 mm of the cathode. Integrating Equation (2) from x=9 mm to x=10 mm yields a normalized interaction probability of 16%, whereas integrating from x=0 mm to x=1 mm yields a normalized gamma-ray interaction probability of 3.9%. Hence, over four times as many events occur within 1 mm of the cathode than within 1 mm of the anode, which serves to demonstrate that the accumulated gamma-ray pulse height spectrum will be formed primarily from electron dominated induced charge pulses. The probability of electron-dominated induced charge motion is much higher than hole-dominated induced charge motion for simple geometric reasons.

The signal formation from a basic planar type semiconductor detector has a linear dependence between the carrier travel distance and the induced charge (Day, Dearnaley and Palms, 1967; Knoll and McGregor, 1993). Such a relationship is not true when the contacts of a device are not the same size (Shockley, 1938; Barrett, Eskin and Barber, 1995). The "small pixel" effect is a unique weighting potential and induced charge dependence observed with devices having different sized electrodes (Barrett, Eskin and Barber, 1995).

In the case that a detector has a small anode and a large cathode, the weighting potential changes much more abruptly near the anode than the region near the cathode. As a result, more charge is induced as charge carriers move in the vicinity of the small anode than charge carriers moving in the vicinity near the cathode. From the natural effect of geometrical weighting, more charge carrier pairs are produced near the cathode over that of the anode. As a result, more electrons will be drifted to the region near the small anode than the number of holes "born" at the small anode. The result is that the induced charge influenced by the electron carriers becomes even greater when the small pixel effect is coupled to the geometrically weighted effect. The combined effects of geometrical weighting and the small pixel effect cause the formation of a "pseudo-peak", a peak that is gamma-ray energy dependent, but forms as a direct consequence of the geometrical shape of the device and the device electrodes.

Device performance is best with the Frisch grid turned on due to the hole charge motion screening (McGregor et al., 1999; McGregor and Rojeski, 1999; McGregor et al. 1998). The Frisch grid acts as the reference plane by which charge carriers induce charge on the anode. Only after electrons pass into the measurement region (see FIG. 5) do they begin to form an induced charge signal on the preamplifier. Since holes are moving in the opposite direction (toward the cathode), the difficulties imposed by hole trapping are significantly negated.

Charge carriers excited in the "interaction region" are drifted into a "measurement region". The measured induced charge begins to accumulate only when the free carriers enter into the measurement region, hence the device is designed such that carrier transport comes mainly from electrons moving into the interaction region.

Research has been undertaken in France to use AR for the teleoperation of robots in nuclear environments in order to develop safer and more efficient procedures for maintenance and dismantling (Viala and Letelleir, 1997). Telerobotics using AR is also being explored by research groups in the United States whose goal is to develop a semi-autonomous robot using a VE of the nuclear power plant being used (Rocheleau and Crane, 1991). The most pertinent research project whose purpose is to perform a radiological analysis by VR simulation for predicting radiation doses for robotic equipment working at the Hanford Site (Knight et al. 1997). The outcome of this research was to provide a static representation of radiation. Mapping vasculature at an angiographic level of detail is described by Bullitt et al. and Chen and Metz. However, 3D digital angiography involves relatively simple, string-like geometries which lend themselves to easy visualization using its method, and it also benefits from a fixed user position relative to the structures of interest.

U.S. Pat. No. 5,418,364 to Hale discloses an optically multiplexed dual line of sight system. Dual lines of sight pass through dual independent thermal references and produce two separate video signals, which can be viewed separately or simultaneously.

U.S. Pat. No. 4,931,653 to Hamm discloses an ionizing radiation detector system. The system determines the three-dimensional spatial distribution of all secondary electrons produced. A 3-D image is reconstructed by combining the digital images produced by video cameras. The system analyzes the electromagnetic spectrum from visible through gamma-ray radiation.

U.S. Pat. No. 4,957,369 to Antonsson discloses an apparatus for measuring three-dimensional surface geometries. A pair of diode detectors, mounted on the focal length of the cameras, reconstruct the full three-dimensional geometry of the surface examined using infrared radiation.

The following U.S. patents provide general background information: U.S. Pat. Nos. 3,932,861; 4,118,733; 4,868,652; and 5,534,694.

DISCLOSURE OF INVENTION

An object of the present invention is to provide a method and system for high-speed, 3D imaging of optically-invisible radiation and detector and array of such detectors for use therein wherein 3D radiation images are superimposed on a view of the environment.

In carrying out the above object and other objects of the present invention, a method is provided for high-speed, 3D imaging of optically-invisible radiation. The method includes detecting optically-invisible radiation within an environment to obtain signals and processing the signals to obtain stereoscopic data. The method also includes displaying the stereoscopic data in the form of optically-visible radiation images superimposed on a view of the environment so that a user can obtain a 3D view of the radiation by utilizing natural human stereo imaging processes.

The environment may be a virtual environment (i.e. generated using a computer or other means) or it may be an optically-visible (i.e. physical or real) environment.

The radiation may be ionizing radiation or may be infrared radiation. Ionizing radiation works to stimulate detectors; such radiation includes charged particles, electromagnetic waves and neutrons-sensitive coatings (like $^9B$, $^6Li$).

In further carrying out the above object and other objects of the present invention, a system is provided for high-speed, 3D imaging of optically-invisible radiation. The system includes a detector subsystem for detecting optically-invisible radiation within an environment to obtain signals and a signal processor for processing the signals to obtain stereoscopic data. The system also includes a display subsystem for displaying the stereoscopic data in the form of optically-visible radiation images superimposed on a view of the environment so that a user can obtain a 3D view of the radiation by utilizing natural human stereo imaging processes.

The detector subsystem may include a set of field detectors, a set of point detectors, a set of passive detectors, and/or a set of active detectors.

The radiation may be gamma-ray radiation wherein the set of field detectors includes a pair of gamma-ray cameras. The gamma-ray cameras may be scanning gamma-ray cameras wherein each of the gamma-ray cameras is capable of scanning the environment through a plurality of angles and wherein the signals are processed to locate a source within the environment.

The radiation may be ionizing radiation wherein the detector subsystem includes a scintillator and a collimator for directing the ionizing radiation into the scintillator or any other radiation detector which may be curved.

The detector subsystem may include a compound eye detector including a plurality of individual detectors. The plurality of individual detectors may be movable independently or as a group. The compound eye detector may include a single detector movable in three dimensions.

The signal processor may process the signals to obtain a 3D map of radiation-emitting sources.

The detector subsystem may have stereoscopic capabilities and may be portable.

The display subsystem may include a see-through display subsystem such as a screen which may be portable or head-mountable. The system may then include a tracking subsystem for tracking the display subsystem.

The system typically provides real-time visual feedback about the location and relative strength of at least one radiation-emitting source.

Still further in carrying out the above objects and other objects of the present invention, an ionizing radiation detector is provided. The detector includes an ionization substrate for converting ionizing radiation into a signal, a converter coupled to the substrate for converting the signal into a corresponding electrical signal, and a positioner for moving the substrate in three dimensions to image over a surface of a sphere.

The substrate may be a scintillator for converting ionizating radiation into photons of light. The signal is an optical signal and the converter may be a photodetector or a multiplier phototube.

Yet still further in carrying out the above objects and other objects of the present invention, an array of detectors is provided wherein each of the detectors is a detector as noted above. The detectors are arranged in a curvilinear geometry. For example, the detectors may be arranged so that the array forms a substantially hemispherical device.

Preferably, the substrates of the detectors are formed from separate materials.

Still further in carrying out the above objects and other objects of the present invention, an ionizing radiation detector is provided. The detector includes an ionization substrate formed from a single material. The substrate may have a curved first surface and a second surface opposing the first surface for converting ionizing radiation at the curved first surface into a signal. The detector also includes a radiation shield disposed at the second surface to substantially block ionizing radiation at the second surface.

The radiation shield may be a fanned collimator. The ionization substrate may be a curved scintillator for converting ionizating radiation into photons of light.

The ionization substrate may be a semiconductor substrate.

The detector may form a substantially hemispherical device.

Preferably, the second surface is curved and is substantially parallel to the curved first surface.

The method and system of the present invention have several unique benefits for potential users. In general, the invention has its strongest applications in dose minimization since it allows the user to see the radiation in the environment she is working in. For example, there are many instances when one desires to locate radioactive contamination in an environment. These environments can be quite complex thus requiring more sophisticated images than the standard 2D images. Contamination searches are presently conducted by a radiation worker with a survey meter who spends a great deal of time inspecting the environment by hand. The invention would allow the user to obtain rapid 3D radiation maps in real-time. Should the source by moving or changing, this would be able to be monitored. Thus, the clean up of the contamination would be significantly faster, reducing the worker's exposure to the radiation. This application would be extremely useful to any industrial or laboratory setting which uses gamma-ray radiation.

Another example involves the survey of waste drums or casks such as those stored at Hanford National Laboratory (HNL), a facility run by the Department of Energy. Such containers require constant monitoring to determine if they are leaking. This monitoring could be quickly and easily achieved by the invention which would minimize worker time and possible exposures to unnecessary amounts of radiation.

These casks at HNL and similar casks and waste drums would provide another interesting problem that the invention could solve. It is frequently the case that little is known about the isotropic concentration of materials within the containers. For example, the HNL casks are a sludge of various radioisotopes, but little is known about where within the cask each isotope is located. It is also possible that there could be various types of solid waste within a waste drum, but its position and orientation within the drum is not known. Using its spectroscopic features, the method and system of the invention can select an energy region of interest and image just materials emitting that particular energy, thus determining the position within the drum or cask of materials of the isotope in question.

The above objects and other objects, features, and advantages of the present invention are readily apparent from the following detailed description of the best mode for carrying out the invention when taken in connection with the accompanying drawings.

BRIEF DESCRIPTION OF DRAWINGS

FIG. 1 is a block diagram schematic view of a system constructed in accordance with the present invention wherein a 3D gamma-ray detection subsystem is coupled to an augmented reality radiation display subsystem;

FIG. 2 is a schematic view of a scanning gamma camera subsystem; the cameras illustrated are able to scan the environment through various angles; triangulation of the source is achieved by matching the points of highest intensity and the distance of the source is then determined by calculating the parallax between the converging lines of sight of various angles with simple geometric considerations;

FIG. 3 is a schematic view of a fanned (or radial) collimator and a curved scintillator;

FIGS. 4a and 4b are schematic views of a compound eye detector; FIG. 4a represents the single detector version of this radiation camera which is capable of rotating in three dimensions to image over the surface of a sphere, thus creating an active compound eye; FIG. 4b is a cross section of a collection of multiple detectors similar to the view of FIG. 4a which create a passive compound eye; and FIG. 5 is a view of a geometrically weighted semiconductor Frisch grid radiation spectrometer which may be used in the method and system of the invention.

BEST MODE FOR CARRYING OUT THE INVENTION

The method and system of the present invention solves the broad problem of detecting physical things, such as ionizing and non-ionizing radiation, that are not able to be easily and directly perceived by human vision and presenting the radiation using methods of supplementing optical input data with other information such as by augmented reality (AR) and using some visualization method for displaying these data as shown in FIG. 1. This invention may combine the principles of computerized tomography (in particular, limited angle emission tomography, simplified by the lack of significant attenuation of transmitted photons in air) or other alternatives such as the techniques of computer vision to produce data to be viewed in 3D using AR.

The computer of FIG. 1 may be programmed to perform tomographic algorithms which are able to reconstruct 3D images rapidly, and are accompanied by an additional algorithm or hardware device to derive stereoscopic data from the resulting 3D maps. These data or other forms of data from detectors are then fed to human eyes to allow for 3D stereoscopic visualization of the optically invisible substance, source, or field. An alternative to using computerized tomography is the use of computer vision or other specialized computational algorithms to produce stereoscopic data sets from simple pairs (or more) of 2D views as optionally noted in FIG. 1.

Special designs of a detection subsystem, examples of which are noted below, eliminate the requirement of having either a computerized tomographic method or computer vision algorithm. With special attention paid to the selection of the detectors themselves (optimized efficiencies), the devices could operate in real-time. This may be more difficult for some types of the "invisible to the eyes" radiation or other substances. This problem is circumvented by the use of a specialized, rapid computer vision algorithms, or alternative detection subsystem designs with direct display to the eyes, or data obtained from 3-D reconstruction. A different approach would be to move the detection subsystems in such a fashion that all signals originating from one plane of interest are blurred. Motion could be changed to then "focus" on other planes, and the results or set of results processed in order to derive appropriately stereoscopic data sets for input to a display subsystem.

AR or other methods applied to this overall problem require special care in the display of the data, so that: 1) the objects being added to the physical, optically-opaque reality are easily visualized; 2) the physical (optically-opaque) reality can be seen into to reveal the data of interest; and 3) the physical reality can be viewed through the previously optically-invisible data being displayed. Such displays most likely will be of stationary or moving dots, groups of dots, spheres, groups of spheres, or other objects possibly with a cloud-like appearance as well as three-dimensional surface (s) and wire-frame, computer-generated objects. The best approach, however, is yet to be determined and may need to be adjusted for the needs and capabilities of individual users. Optically invisible substances, sources, or fields with signals emanating from behind optically opaque objects could appear to be (appropriately) located behind these physical objects (e.g. allowing one to "see through" walls). In some cases, the signal could be attenuated in magnitude as a result of passage through the physical barriers (unless point detectors are placed in those locations). Because the physical barriers would still be apparent to the user, the user will learn to use these clues to mentally adjust for any signal attenuation. Some training of the user in visualizations using the methods may be needed with the system for optimal performance. More complex feature identification techniques, possibly including distance-to-object sensors, could be used to further enhance performance of the overall system.

Variations on each of the portions of the system for stereoscopic display (AR or other methods) of "invisible" data follow. The example of ionizing radiation (x-rays and gamma-rays) will be primarily used for illustrative purposes in the discussion which follows.

Detectors of the System

A key component for the system is the detector subsystem which, as indicated, can include either a point detector (a detector which obtains data from a single point such as a voltmeter) or a field detector (a detector that is capable of obtaining data from a variety of points simultaneously such as an optical camera). Table 1 illustrates examples of the types of detectors that could be used with the overall approach, corresponding to different types of optically-invisible substances for which visualization is desired. This list is by no means exhaustive, and does not contain all possible point and field detectors.

TABLE 1

Example set of point and field detectors. Most point detectors listed below are passive, or detectors that would require a network of point detectors at various locations. *denotes point detectors that are active, or systems that would not require a network of detectors but would actively detect these quantities remotely.

| Field | Point |
| --- | --- |
| Gamma-ray cameras | Alpha particle detectors |
| X-ray cameras | Beta particle detectors |
| Infrared/temperature-sensitive cameras | Smoke detectors |
| Neutron radiographs | Chemical sensors |
| Positron emission tomographs | Laser-scanning spectrographs* |
| Single photon emission tomographs | Thermometers |
| Flow velocity and acceleration meters | Gauss meters (magnetic field) |
| Laser/radar/ledar range finders | Laser transmission for smoke detection* |
| | Neutron detectors (i.e. non-radiographs) |

Additional care must be taken in the selection of the detector subsystem to ensure that appropriate stereoscopic data result. For example, the primary detector subsystem used for the ionizing radiation visualization could be a pair of gamma-ray cameras adapted to provide stereoscopic data. For optimal performance, these cameras would require not only planar imaging capability from different angles, but focusing or production by other means of the image information needed for stereoscopic vision.

Gamma-ray cameras are not able to "focus" gamma-rays which is a primary requirement for stereo vision. Thus, compensation for this is required to achieve the best possible result. A variety of camera designs are possible to achieve this. One approach would be through source location by computed parallax obtained by two gamma cameras which would swing through a series of angles to pin-point the location of the radiation (see FIG. 2). This method would require a computer algorithm to determine the parallax angle or angles where the maximum amount of radiation is detected for each camera and then perform the necessary geometric calculations to determine the source position. Other computational approaches may be possible.

Referring now to FIGS. 3, 4a and 4b, ionizing radiation detectors may be manufactured or configured in a curved geometry to allow the simultaneous detection of ionizing radiation from multiple angles in a "lens-like" fashion. Combinations of multiple detector systems could be combined to obtain three-dimensional information about ionizing radiation source distributions. Curved detector configurations can be accomplished through employment of a curved scintillator or semiconductor or other detector combined with an appropriately shaped collimation system.

Alternatively, multiple detector units can be configured in a semicircle or as a hemisphere in a convex arrangement relative to the environment being examined. Such an arrangement would allow a shifting in the positions of the detectors to "focus" on an area or improve sampling for better data (image) quality. One way of accomplishing this is to place individual detectors at the ends of "arms" which may be moved within given angles to adjust the number of detectors looking in a given direction as illustrated in FIG. 4b.

A second radiation camera possibility exists if one uses techniques similar to the above using a fanned (or radial) collimator. If such a collimator is used to direct the gamma rays into a curved scintillator, then it would be possible to derive the distance to the source by examining the output signal at various regions of the detector to determine, by a series of mathematical weights, the location and distance to the source (see FIG. 3). Again, other computational methods of doing this may be possible. This design functions, effectively, as a focused radiation eye (although it is technically not an "x-ray lens" since the x-rays are not bent). Similar results could possibly be achieved by using a lens or similar material to focus the light created by the scintillator (in any configuration), or other signals created from detectors which are capable of being focused, before it reaches the eye or, display device.

Another design example is based upon how the eye of an insect works. The principle behind such a detector is that there are multiple individual detectors with feedback to a processor, as shown in FIG. 4a. As in the case of the insect, such as a fly which has multiple "lenses" making up each one of its eyes, the output of each detector (or "lens") is considered by the human (insect's) brain to derive 3D and stereoscopic information. If the detector contains an image, for example a radioactive source, its image is compared with images from all other detectors with source information. The processor (analogous to the insect's brain) then interpolates between each of the detectors to determine both the location and the distance to the source. For this invention, the processor could be electronic, physical, or optical, or inherent in the detection system itself. The output data from such a processor would be those data which the human brain could then interpret appropriately. A design having multiple detectors viewing "lines" at different angles in the environment has several advantages. Such a design could enable the use of radiation detectors with superior energy resolution (for determining different types or energies of radiation, which could be displayed differently for ease of visualization) which otherwise would be difficult to apply to this situation (or any situation requiring broad area radiation detectors, for that matter) because of limitation in the size which such detectors can be manufactured. The individual detectors can be moved independently or as a group to adjust the angle and field of view of the eye, or, alternatively, to change its effective focus.

Further, a series of point detectors could be used to obtain data to be displayed in AR or other techniques using similar means of visualization to the above. In this case, the point detectors, fixed in space, would be used to obtain a 3D map of the substances, sources or fields in the environment. The computer could use a mapping algorithm, possibly associated with a computer simulation model, to reconstruct and interpolate the data into one smooth 3D map. This map could then be processed to obtain the necessary stereoscopic data.

The ideal detector would be a detector that would have a wide field-of-view in order to obtain the most information from the environment in one image as possible. It would be sensitive to low levels of the substance, source, or field, yet still be able to provide resolved data for high levels. The detector should ideally function in real-time thus placing significant constraints on both the detector efficiency as well as the computer processing algorithms used to generate the stereoscopic data. It should be able to function remotely so that should the strength of the substance, source, or field be too strong, this would not pose an unnecessary hazard to the user. In order to be able to display different energies or types of optically invisible signals, the detector would need spectroscopic capabilities. Finally, the detector should be as portable as possible to allow for the most flexibility of use in a wide variety of environments.

Visualization and Data Display

Once the stereoscopic data have been obtained and the computer processing has been performed, the stereoscopic data have to be output to the display. This requires a visualization process to display the data so that the user receives the most possible information from the graphical representation of the optically invisible data. Thus, from the generated image, the user would perceive information about both the detected substance, source, or field strength type, energy, or quantity and its location. However, this display must not interfere with the user's view of the real world. The real world provides a context for the location of the sources relative to other objects in the real environment. So the visualization process must not only accurately and efficiently represent the data, but it must do so such that augmentation of the normal human perception does not interfere with the data the user's senses collect naturally. This includes the natural human stereo imaging processes such as parallel line convergence, binocular disparity, shading and texture cues, and image motion parallax.

Part of the process imaging the data includes determining how to best display the stereoscopic data and present other, related information such as intensity/concentration of substances/sources/fields, types of sources/fields, distances to maximum field/source strength, and warning signals for significant hazards which might be detected. For example, the visualization scheme needs to be able to provide the user with a broad variety of tools and different display methods to display the data optimally. Additional information could be determined through processing of the collected data and using the computer to identify significant features and substance, source, or field strengths or weaknesses. These data could be displayed as numerical or graphical information along with the stereoscopic data superimposed upon reality. Auditory information could be added as supplementary input to the user.

The selected method of stereoscopic data display will influence the observer's performance in interpreting the data, detecting local and temporal variations, sensing small or subtle signals, and possible other desirable tasks. One must thus determine what the best means to display gamma-ray radiation would be. This could include, but is not limited to, using the following moving or stationary virtual objects for visualization: moving dots; dot clouds; spheres in different sizes and colors; sphere clouds; optical "sparks" for each count detected; expanding bubbles; hazy clouds; shaded voxels with different shades representing different source strengths; variable opacities with more opaque regions corresponding to regions of more radiation; blinking lights indicating the region of a detected count; displaying the entire room in various colors including time-variant patterns to indicate the source strengths and their locations; floating numbers to represent the number of detected counts in a region; or 3D surface contour plots indicating a 3D radiation map.

Referring again to FIG. 1, in another embodiment of the present invention, a pair of CCD cameras are coupled to the gamma-ray cameras for obtaining information about physical architecture of an environment such as a room. In this embodiment, software rapidly renders a realistic, navigable, interactive graphical representation, or Virtual Environment (VE), which is displayed using a fully immersive CAVE system. The 3D radiation dose rate information is used to simulate radiation in the VE, resulting in a Virtual Radiation Environment (VRE). Rehearsal of procedures could be performed in the VRE, with accurate estimations of virtual doses using the continuous tracking of an individual's location in the VRE. The invention thereby provides tools for actively managing worker doses and is also helpful for both accident management (dose reconstruction) and robotic operations in high dose-rate environments.

For simulation of radiation environments using Virtual Reality (VR), rapid rendering of a simulation of the physical environment is required for combination with the 3D radiation source distribution information. In order to accomplish this, the two charge coupled device (CCD) cameras are mounted, at angles, on a motorized table with the gamma-ray cameras. Software based upon known quantitative stereoscopic imaging techniques is utilized to obtain 3D information about the environment. The detection system is capable of surveying the environment to obtain information both about physical objects in the room as well as the location of any sources of radiation. Information is collected by a computer which will then output the physical architecture of the room, which is processed using software, in order to rapidly create a VE. The VE is viewed in a CAVE (cave automatic visual environment) where the user will be able to visualize the radiation, if desired, and its location relative to the physical objects in the room. Information about the CAVE user's position as a function of time is combined with the information about the radiation dose distributions to make estimates of "virtual radiation dose". The Virtual Radiation Environment (VRE) has application to high radiation environments, with the data collection system mounted on a robot.

Another embodiment of the method and system of the present invention includes specific radionuclide detection using a CdZnTe detector or any other type of detector. The system of the invention allows more rapid, real-time assessment of the locations of gamma-emitting materials which could be used in nuclear weapons thus allowing for CTBT verification without requiring after-the-fact detonation. The radiation imaging system also has significant application in assisting in the 3D location of contamination for procedures in very high radiation fields in which robotic labor is to be employed, as previously described.

The detector subsystem in three dimensions locates gamma-ray emission from materials that could be used in nuclear weapons. The detector subsystem includes two NaI(T1) or other detectors in Anger cameras to be used to locate the radioactive source and two CdZnTe or other type of detectors which will be used to spectroscopically identify the radionuclide. The data will then be conveyed to the user via the display subsystem so the user will be able to "see" the radiation, thus identifying its locations in real-time.

The dual Anger camera subsystem is sensitive to low doses of radiation and has a wide field of view. The subsystem creates basic radiation images taken from slightly different angles. The cameras, each offset by a given angle, scan the environment and obtain sufficient information to construct a 3D profile of the radiation source distribution. The initial NaI(T1) or detector search device is used to locate with acceptable efficiency and confidence a region that demonstrates statistically higher levels of radiation. Although the system allows for crude energy resolution of gamma-rays, the performance falls short of the necessary energy resolution required to confidently identify gamma-ray-emitting isotopes. Hence, the NaI(T1) cameras serve to quickly locate regions of radiation and produce a low resolution gamma-ray spectrum of the region under investigation. To positively identify the presence of special nuclear materials and related by-products from nuclear weapons tests, a portable, high energy resolution device should accompany each NaI(T1) detector. Other area detectors besides Anger cameras could be used. Other selections of radiation detector materials are also possible.

A series of CdZnTe or other semiconductors, scintillators, or other radiation detectors like the one illustrated in FIG. 5 are dynamically linked to the Anger camera or other area detection or positionally sensitive detection system. These detectors typically are mounted on collimated rods such that the direction and field-of-view of the array may be easily adjusted to view different volumes of different sizes in the environment. Once radiation is detected by the Anger cameras, the CdZnTe system alters its direction and size of field-of-view to obtain spectroscopic information from the source located by the 3D Anger camera imaging system for radionuclide identification. The resulting data is processed utilizing software. Prior art image reconstruction algorithms for obtaining 2D and/or 3D maps make the system real-time. The combination of dual Anger cameras, CdZnTe detectors, visualization hardware, and necessary software result in an Augmented Reality Radiation Display System (ARRDS).

Once the collection of 2D and 3D information is achieved, the positional information about the source is used as input data for code written in VRML or any other software or hardware implementation, which generate the display of the radiation in AR. Radiation incident on the camera system appears in 3D to the user. Colors, textures, and intensities may be utilized to display the information to the user. To further minimize the potential for damage or interference in high radiation fields, only those components whose presence in the environment is required is exposed to radiation. These include the camera system, the motion tracker, and the HMD or other device to achieve the same end result. Further damage can be minimized by only having the motion tracker and HMD in the environment while the user is viewing the VR image and not during the image acquiring and reconstruction processes.

Relatively large volume CdZnTe trapezoid Frisch grid gamma-ray spectrometers may be coupled to the NaI(T1) search devices. The compound scintillation/semiconductor detector operates and accumulates data in real-time, is portable, and operates at room temperature.

Geometrically-weighted, semiconductor Frisch grid detectors function as room-temperature-operated, portable gamma-ray spectrometers. Arranging many trapezoid detectors into an array can increase gamma-ray counting efficiency. Simply circuitry with modern miniaturized electronics allow for the realization of such a device, including compensation for slight signal differences between individual detectors. Obviously, other detectors are possible such as coplanar and/or drift detectors, detectors in a variety of geometries, etc.

While the best mode for carrying out the invention has been described in detail, those familiar with the art to which this invention relates will recognize various alternative designs and embodiments for practicing the invention as defined by the following claims.

What is claimed is:

1. A method for high-speed, 3D imaging of optically-invisible radiation, the method comprising:

detecting optically-invisible ionizing radiation emitted within an optically-opaque environment to obtain signals using two or more ionizing radiation detectors for converting the ionizing radiation into the signals;

processing the signals to obtain stereoscopic data; and displaying the stereoscopic data directly to a user's eyes in the form of optically-visible radiation images superimposed on a view of the environment so that the user can obtain a stereoscopic 3D view of the radiation by utilizing natural human stereo imaging processes, wherein the stereoscopic 3D view does not interfere with the user's view of the environment.

2. The method as claimed in claim 1 wherein the environment is a virtual environment.

3. The method as claimed in claim 1 wherein the environment is an optically-visible environment.

4. The method as claimed in claim 1 further comprising energizing material so that the material emits or deflects the ionizing radiation.

5. A system for high-speed, 3D imaging of optically-invisible radiation, the system comprising:

a detector subsystem for detecting optically-invisible ionizing radiation emitted within an optically-opaque environment to obtain signals using two or more ionizing radiation detectors for converting the ionizing radiation into the signals;

a signal processor for processing the signals to obtain stereoscopic data; and a display subsystem for displaying the stereoscopic data directly to a user's eyes in the form of optically-visible radiation images superimposed on a view of the environment so that the user can obtain a stereoscopic 3D view of the radiation by utilizing natural human stereo imaging processes, wherein the stereoscopic 3D view does not interfere with the user's view of the environment.

6. The system as claimed in claim 5 wherein the environment is a virtual environment.

7. The system as claimed in claim 5 wherein the environment is an optically-visible environment.

8. The system as claimed in claim 5 further comprising means for energizing material so that the material emits or deflects the ionizing radiation.

9. The system as claimed in claim 5 wherein the detector subsystem includes a set of field or area detectors.

10. The system as claimed in claim 9 wherein the radiation is gamma-ray radiation and wherein the set of field detectors includes a pair of gamma-ray or other positional radiation detectors.

11. The system as claimed in claim 10 wherein the gamma-ray cameras are scanning gamma-ray cameras and wherein each of the gamma-ray cameras is capable of scanning the environment through a plurality of angles and wherein the signals are processed to locate a source within the environment.

12. The system as claimed in claim 5 wherein the detector subsystem includes a set of point detectors.

13. The system as claimed in claim 12 wherein the signal processor processes the signals to obtain a 3D map of radiation-emitting sources.

14. The system as claimed in claim 5 wherein the detector subsystem includes a set of passive detectors.

15. The system as claimed in claim 5 wherein the detector subsystem includes a set of active detectors.

16. The system as claimed in claim 5 wherein the detector subsystem includes a scintillator and a collimator for directing the ionizing radiation into the scintillator.

17. The system as claimed in claim 16 wherein the scintillator is curved.

18. The system as claimed in claim 5 wherein the detector subsystem includes a compound eye detector.

19. The system as claimed in claim 18 wherein the compound eye detector includes a plurality of individual detectors.

20. The system as claimed in claim 19 wherein the plurality of individual detectors are movable independently or as a group.

21. The system as claimed in claim 18 wherein the compound eye detector includes a single detector movable in three dimensions.

22. The system as claimed in claim 5 wherein the detector subsystem has stereoscopic capabilities.

23. The system as claimed in claim 5 wherein the detector subsystem is portable.

24. The system as claimed in claim 5 wherein the display subsystem includes a see-through display subsystem and wherein the system further includes a tracking system for tracking the display subsystem.

25. The system as claimed in claim 24 wherein the display subsystem is head-mountable.

26. The system as claimed in claim 5 wherein the system provides real-time visual feedback about location and relative strength of at least one radiation-emitting source.

* * * * *